(12) United States Patent
Son (10) Patent No.: US 6,251,760 B1
(45) Date of Patent: Jun. 26, 2001

(54) SEMICONDUCTOR DEVICE AND ITS WIRING AND A FABRICATION METHOD THEREOF

(75) Inventor: Jeong-Hwan Son, Daejon (KR)

(73) Assignee: Hyundai Electronics Industries Co. Ltd., Kyoungki-do (KR)

( * ) Notice: Subject to any disclaimer, the term of this patent is extended or adjusted under 35 U.S.C. 154(b) by 0 days.

(21) Appl. No.: 09/233,171

(22) Filed: Jan. 19, 1999

(30) Foreign Application Priority Data

Jan. 19, 1998 (KR) ................................. 98-1390

(51) Int. Cl.[7] ............. H01L 21/3205; H01L 21/4763; H01L 21/44
(52) U.S. Cl. ............. 438/585; 438/592; 438/596; 438/652; 438/653; 438/657
(58) Field of Search ................ 438/585, 592, 438/595, 596, 652, 653, 655, 656, 657

(56) References Cited

U.S. PATENT DOCUMENTS

| | | |
|---|---|---|
| 4,641,170 | * 2/1987 | Ogura et al. . |
| 5,489,543 | * 2/1996 | Hong . |
| 5,538,913 | * 7/1996 | Hong . |
| 5,668,021 | * 9/1997 | Subramanian et al. . |
| 5,750,430 | * 5/1998 | Son . |
| 5,780,340 | * 7/1998 | Gardner et al. . |
| 5,960,270 | * 9/1999 | Misra et al. . |
| 5,962,894 | * 10/1999 | Gardner et al. ............. 257/330 |
| 5,981,368 | * 11/1998 | Gardner et al. . |
| 6,001,695 | * 12/1999 | Wu . |
| 6,051,470 | * 4/2000 | An et al. . |

* cited by examiner

Primary Examiner—Richard Booth
Assistant Examiner—Ron Pompey

(57) ABSTRACT

A semiconductor device and a wiring therefor and a fabrication method thereof are disclosed, which are capable of providing a good current driving capability without degrading the characteristic of the semiconductor device by overcoming the problems encountered in the known semiconductor device, and a wiring is implemented by using e semiconductor device fabricated in accordance with the present invention.

15 Claims, 7 Drawing Sheets

SEMICONDUCTOR DEVICE AND ITS WIRING AND A FABRICATION METHOD THEREOF

BACKGROUND OF THE INVENTION

1. Field of the Invention

The present invention relates to a semiconductor device and its wiring and a fabrication method thereof. More specifically, the present invention relates to an improved semiconductor device and its wiring and a fabrication method thereof which are implemented by serially arranging at least two films which have different materials from each other.

2. Description of the Background Art

The gate electrode of a known semiconductor device is formed in a structure where a silicide layer or a metal layer is deposited on a polysilicon layer in order to decrease resistance. The gate electrode includes wiring for transferring electrical signals therethrough. Therefore, the gate electrode represents all kinds of wiring which are used as an element of the transistor and which are used for the semiconductor device for transferring electrical signals.

Recently, a multilayer film gate electrode technique has been developed to form a polysilicon layer, a diffusion barrier layer and a metallic film when the ource and/or drain are formed via a self-alignment technique. In the multilayer film gate electrode technique, a dopant diffusion barrier layer consisting of a titanium nitride TiN is formed between a polysilicon layer and a suicide layer.

In addition, conventional devices are known to utilize a multilayer film structure of a polysilicon layer and a metal film, or a polysilicon, a diffusion barrier layer and a metal film. Also, the electrical characteristics of a gate electrode which is formed in a single layer structure of a metallic layer were reported.

The known wiring(gate electrode) of a semiconductor device and a wiring structure thereof will now be explained with reference to the accompanying drawings.

Figure 1A:
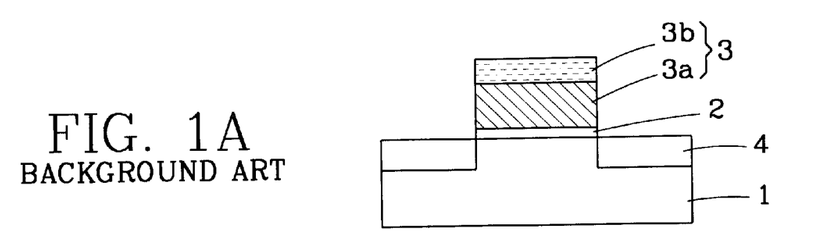
FIGS. 1A through 1C are cross-sectional views illustrating the wiring and construction of a known semiconductor device.

FIG. 1A illustrates the structure of a known semiconductor device. A p-type semiconductor substrate is generally used for fabricating an n-channel transistor and an n-type semiconductor substrate is used for fabricating a p-channel transistor. The semiconductor device having an n-channel transistor will now be explained An insulation film 2 is formed on the upper surface of a semiconductor substrate 1 which is doped with a p-type impurity, a gate electrode 3 is formed on the insulation film 2 and a conductive n-type dopant layer 4 is formed at the surface of the semiconductor substrate 1 at both sides of the gate electrode 3. At this time, the insulation film 2 is generally an oxide film which is formed by a thermal oxide method. Alternatively, the insulation film 2 may be an insulator having a high dielectric constant such as a nitride film. The insulation film 2 is well known as a gate oxide film. The gate electrode 3 is formed of a multilayer film having a metal layer pattern or a silicide layer pattern 3b deposited on a doped polysilicon layer pattern 3a. Hereinafter, the metal layer and the silicide layer are referred as a metallic film. Therefore, the metallic film pattern 3b denotes a metal layer pattern or a silicide layer pattern. As the metallic film pattern 3b which is an upper layer of the gate electrode 3, a metal layer formed of W or TiN, and a silicide layer formed of $TiSi_2$, $CoSi_2$ or $NiSi_2$, etc. are generally used.

Figure 1B:
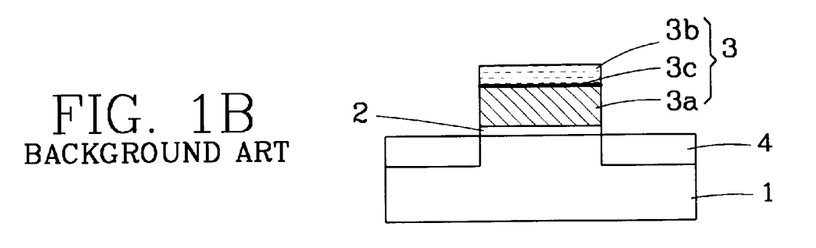

FIG. 1B illustrates another example of the conventional semiconductor device. Namely, the structure of the semiconductor device of FIG. 1B is the same as in FIG. 1A, except that the gate electrode 3 includes a polysilicon layer pattern 3a, a dopant diffusion barrier layer 3c and a metallic film pattern 3b. The dopant diffusion barrier layer 3c is formed of three components containing TiN or WNx, or TiN or WNx itself. The dopant diffusion barrier layer is hereinafter called as a barrier layer.

Figure 1C:
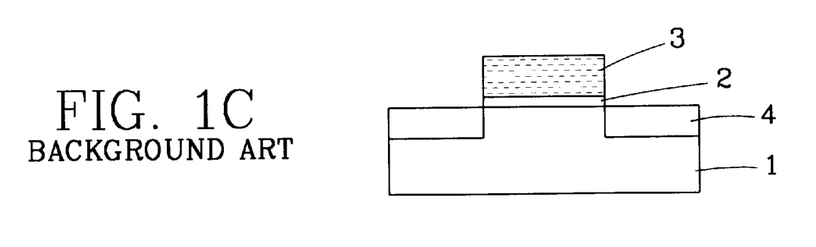

FIG. 1C illustrates yet another example of the conventional semiconductor device which includes a single metallic layer 3 as a gate electrode.

However, the above-described known semiconductor devices have the following problems.

In the above-described semiconductor devices, as shown in FIG. 1A and 1B, when the gate electrode 3 has the multilayer film structure in which the polysilicon layer 3a is deposited on the gate oxide film 2 and the metallic film pattern 3b is formed thereon, the threshold voltage Vt of the semiconductor device is determined based on the work function of the polysilicon and the doping concentration of the channel region, the metallic film pattern decreasing the resistance of the gate electrode.

However, in such semiconductor devices having the gate electrode which is the same as above, when the doping of the polysilicon layer is not sufficiently achieved, as the size of the semiconductor device and the power supply voltage decrease, a depletion layer is formed adjacent to the interface between the polysilicon and the gate insulation film, which results in deterioration of the current driving force of the semiconductor device, for example increase in Vt, in condition that the surface of the semiconductor substrate is in an inversion mode, namely, when a channel is formed.

In addition, in the polysilicon layer gate electrode, since the gate electrode of the n-channel transistor must be doped with the n-type impurity while the gate electrode of the p-channel transistor must be doped with the p-type impurity, the gate electrodes of the n-channel transistor and the p-channel transistor should be separately fabricated.

In addition, another problem may occur when using only the metallic film as the gate electrode. Specifically, the stress applied to the gate oxide film in which metallic layers of the gate electrode have different thermal expansion coefficients from each other is higher than the stress applied to the polysilicon during the heat treatment process which is performed by a predetermined number during the semiconductor fabrication, which results in decrease in the breakdown voltage, and deterioration of properties of the gate oxide film such as leakage current from the gate electrode.

Furthermore, during the etching process for forming a metallic gate electrode, the gate oxide film may be damaged, thereby degrading the characteristics of the semiconductor device.

Thus, when using the polysilicon layer as the gate electrode, the gate depletion occurs, and also when using the metallic film as the gate electrode, the characteristic of the semiconductor device are degraded due to the short channel effect and the damage of the gate oxide film.

SUMMARY OF THE INVENTION

The present invention is directed to a system that substantially obviates one or more of the problems experienced due to the above and other limitations and disadvantages of the related art.

An object of the present invention is to provide a semiconductor device and a wiring therefor and a fabrication method thereof which are capable of providing an excellent current driving capability without degrading the characteristics of the semiconductor device by making up for the problems encountered in the conventional art.

Another object of the present invention is to provide a semiconductor device and a wiring therefor and a fabrication method thereof in which at least two films having different material from each other are arranged in a horizontal direction.

Another object of the present invention is to provide a semiconductor device and a wiring therefor and a fabrication method thereof which are capable of providing a sandwich type gate electrode or a wiring which is serially formed of a first conductive film pattern/second conductive film pattern/first conductive film pattern and providing a semiconductor device which is fabricated using the above-described wiring.

Another object of the present invention is to provide a semiconductor device and a wiring therefor and a fabrication method thereof which are capable of providing a gate electrode or a wiring in which the first conductive film pattern is a polysilicon layer, and the second conductive film pattern is a metallic film and providing a semiconductor device fabricated using the above-described wiring.

Another object of the present invention is to provide a semiconductor device and a wiring therefor and a fabrication method thereof which are implemented by fabricating by one step the gate electrodes of an n-channel transistor and a p-channel transistor for thereby simplifying the fabrication process.

Other and further objects, features and advantages of the present invention will be set forth in the description that follows, and in part will become apparent from the detailed description, or may be learned by practice of the invention.

To achieve these and other advantages and in accordance with the purpose of the present invention, as embodied and broadly described, the present invention includes an insulation layer formed on the upper surface of the semiconductor substrate, and a gate electrode formed of more than two members which are serially formed on the upper surface of the insulation layer.

To achieve the above objects, there is provided a semiconductor device and a fabrication method thereof which includes a source/drain formed on a semiconductor substrate at both sides of a gate electrode.

To achieve the above objects, there is provided a wiring or gate electrode fabrication method for a semiconductor device, which includes the steps of forming a first conductive film on an upper surface of a semiconductor substrate, patterning the first insulation film, forming an opening, partially exposing the upper surface of the semiconductor substrate, and forming a first insulation film pattern, forming a second insulation film on the upper surface of the exposed semiconductor substrate, forming a pattern (sidewall spacer) in both inner walls of the opening, sequentially filling the opening with the second conductive film pattern, forming a second conductive film on the entire resultant structure of the semiconductor substrate and etching-back the same, fully filling the opening, and removing the first insulation film pattern.

To achieve the above objects, there is provided a fabrication method of a semiconductor device which includes the steps of forming a wiring of the semiconductor device, self-aligning the wiring of the semiconductor device and doping the surface of the semiconductor substrate at both sides of the wiring.

In the above wiring step of the semiconductor device, there is provided a step for partially doping the surface of the semiconductor substrate through an opening before the forming step of the second conductive film.

To achieve the above objects, there is provided a wiring method for a semiconductor device which includes the steps of forming a first insulation film on an upper surface of a semiconductor substrate, patterning the first insulation film and forming a first insulation film pattern and an opening, forming a second insulation film on an upper surface of the semiconductor substrate and on the opening, forming a first conductive film on the entire resultant structure of the semiconductor substrate and etching-back the same and forming a first conductive film pattern on both side walls of the first insulation film pattern, forming a second conductive film on the entire resultant structure of the semiconductor substrate, partially forming a mask pattern on the upper portion of the second conductive film, etching and patterning the second conductive film based on the mask pattern, and removing the mask pattern and the first insulation film pattern.

To achieve the above objects, there is provided a wiring method for a semiconductor device which includes the steps of forming a first insulation film on an upper surface of a semiconductor substrate, patterning the first insulation film and forming an opening and a first insulation film pattern, forming a second insulation film on the upper surface of the semiconductor substrate and on the opening, forming a third insulation film on the entire resultant structure of the semiconductor substrate and etching-back the same and forming a third insulation film pattern on both side walls of the first insulation film pattern, filling the first conductive film pattern into the opening which is not covered by the third insulation film pattern, and removing the third insulation film pattern and filling the second conductive film into the portion formed after removing the third insulation film pattern.

In the above wiring steep for the semiconductor device, there is further provided a step for doping a part of the surface of the semiconductor substrate through the opening before the formation of the first conductive film.

In the above wiring step for the semiconductor device, there is further provided a step for forming a barrier film on side walls of the third insulation film pattern before the formation of the first conductive film.

More preferably, the second insulation film which is exposed through the opening is removed before the formation of the first conductive film, and a fourth insulation film may be formed on the upper surface of the exposed semiconductor substrate. At this time, the fourth insulation film may be made of the same material as the second insulation film or it may be made of a different material. In addition, the thickness of fourth insulation film may be the same as the second insulation film or the thickness thereof may be different from that of the second insulation film.

In addition, after a wiring for a semiconductor device, there is further provided a step for doping the surface of the semiconductor substrate and at both sides of the wiring using the wiring for a semiconductor device as a self-aligning mask.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only. Various changes and modifications that are within the spirit and scope of the invention will become apparent to those skilled in the art fro this detailed description. In fact, other objects, features and characteristics of the present invention; methods, operation, and functions of the related elements of the structure; combinations of parts; and economies of manufacture will surely become apparent from the following detailed description of the preferred embodiments and accompanying drawings, all of which form a part of this specification, wherein like reference numerals designate corresponding parts in various figures.

DETAILED DESCRIPTION OF THE PREFERRED EMBODIMENTS

Reference will now be made in detail to the preferred embodiments of the present invention, examples of which are illustrated in the accompanying drawings. In the drawings, redundant description of like elements and processes, which are designated with like reference numerals, is omitted for brevity.

Figure 2A:
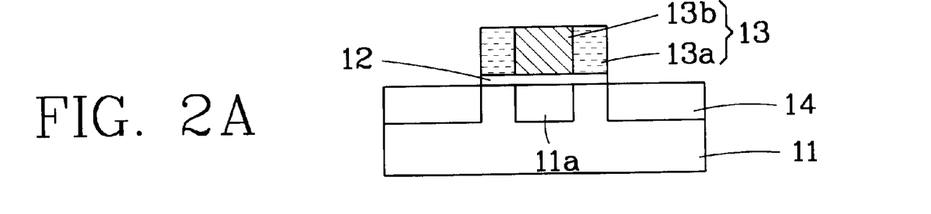
FIGS. 2A through 2D are cross-sectional views illustrating the wiring and construction of a semiconductor device of the present invention.

FIG. 2A illustrates the semiconductor device and the construction of its wiring according to a first embodiment of the present invention. As shown therein, a semiconductor substrate 11 is doped with a first conductive type impurity. When fabricating a p-type MOS transistor, the semiconductor substrate is doped by an n-type impurity. In the present invention, the n-type MOS transistor will be explained. However, although the conductive type of the impurity is contrary for a p-type MOS transistor, remaining elements are the same as the n-type MOS transistor discussed hereinafter.

The semiconductor substrate 11 is doped with the p-type impurity. An insulation film 12 is formed on the semiconductor substrate 11. The insulation film 12 on the P-type impurity is an oxide film formed by a thermal oxide method and is called a gate oxide film. A wiring 13 including a first conductive film pattern 13a, a second conductive film pattern 13b, and another first conductive film pattern 13a is serially arranged on the upper surface of the insulation film 12 (gate insulation film). The wiring 13 is a gate electrode. Here, the first conductive film pattern 13a is a doped polysilicon layer, and the second conductive film pattern 13b is a metallic film. The metallic film is a metallic layer such as W or TiN or a silicide layer such as $TiSi_2$, $CoSi_2$, $NiSi_2$, etc.

Next, a source/drain 14, which is an n-type impurity layer is formed on the surface of the semiconductor substrate at both sides of the wiring or gate electrode 13.

In addition, a high density p-type doping layer 11a is formed on the surface of a part of the semiconductor and below the insulation film 12. The p-type doping layer 11a is used for controlling the threshold voltage. More preferably, the p-type doping layer 11a may not be formed based on the characteristic of the semiconductor device.

Figure 2B:
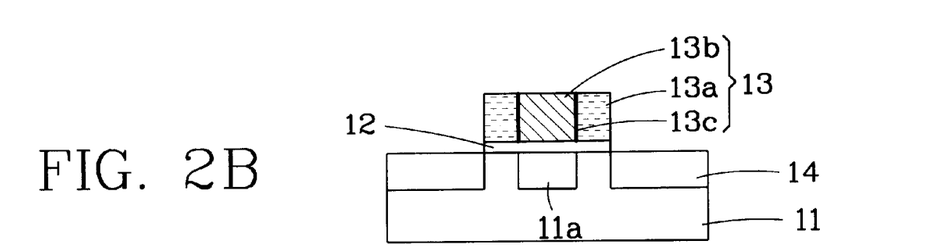

FIG. 2B illustrates a wiring of the semiconductor device according to another example of the first embodiment of the present invention. As shown therein, the construction is the same as the embodiment shown in FIG. 2A except that a barrier film 13c is formed between the first conductive film pattern 13a and the second conductive film pattern 13b. The barrier film is made of TiN, WNx, etc.

Figure 2C:
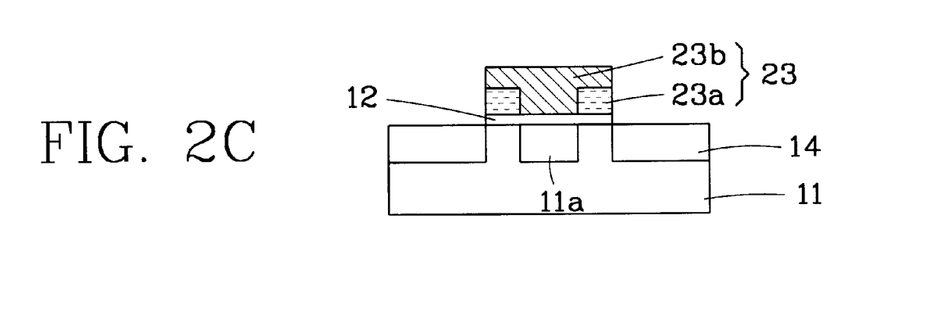

FIG. 2C illustrates the construction of a semiconductor device and a wiring according to a second embodiment of the present invention.

As shown therein, an insulation film or gate oxide film 12 is formed on the p-type semiconductor substrate 11, and a first conductive film pattern 23a is formed on an edge portion of the upper surface of the gate oxide film 12, and a second conductive film pattern 23b is formed on the upper surface and lateral surface of the first conductive film pattern 23a. Here, it is noted that the first conductive film pattern 23a is a polysilicon layer and the second conductive film pattern 23b is a metallic film. The metallic film is a metallic layer such as W or TiN, or a silicide layer such as $TiSi_2$, $CoSi_2$, $NiSi_2$, etc. The combination of the first conductive film pattern 23a and the second conductive film pattern 23b is referred to a wiring 23 of the semiconductor device or a gate electrode 23. A source/drain 14 doped with the n-type impurity is formed at both sides of the wiring 23 on the surface of the semiconductor substrate.

In addition, a high density p-type doping layer 11a is formed on the surface of a part of the semiconductor substrate and below the insulation film 12. It is noted that the p-type doping layer 11a provided for controlling the threshold voltage can be deleted based on the characteristic of the semiconductor device.

Figure 2D:
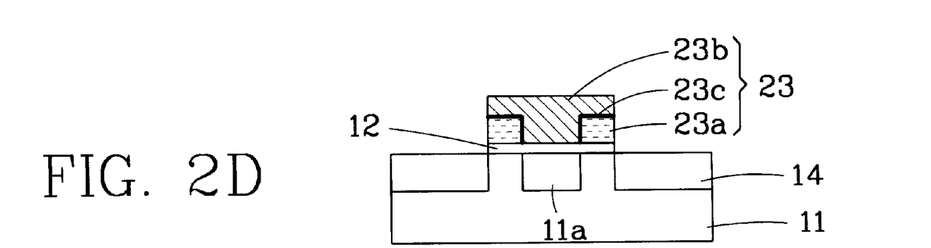

FIG. 2D illustrates another example of the second embodiment of the present invention. The structure thereof is the same as the second embodiment shown in FIG. 2C except that a barrier film 23c of TiN, WN, etc. is formed in an interface between the first conductive film pattern 23a and the second conductive film pattern 23b.

The fabrication method for a semiconductor device according to the present invention will now be explained with reference to the accompanying drawings.

Figure 3A:
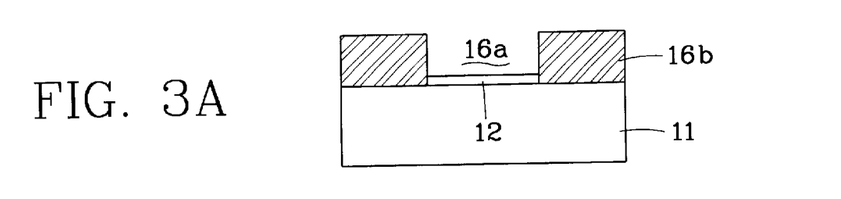
FIGS. 3A through 3F are cross-sectional views illustrating a wiring and a fabrication method of a semiconductor device of FIG. 2A which shows a first embodiment of the present invention.

FIG. 3A is a cross-sectional view illustrating a semiconductor device. As shown therein, the semiconductor substrate 11 is doped with a p-type impurity. The first insulation film 16 (not shown), a nitride film, at a thickness of 500~2000Å is formed on the semiconductor substrate 11 doped with the p-type impurity (hereinafter called a p-type semiconductor substrate) and is patterned for thereby forming an opening 16a on the first insulation film 16, so that a part of the upper surface of the semiconductor substrate 11 is exposed. The first insulation film 16 remained after the patterning is now referred to a first insulation film pattern 16b. The first insulation film 16 is formed of a gate electrode which will be described later and a material having a high etching selection ratio. In the present invention, more preferably, the nitride film is used as a first insulation film.

Next, a second insulation film 12 is formed on the upper surface of the semiconductor substrate 11 which is exposed by the opening 16a. The second insulation film 12 at a thickness of 30~100Å is formed by the thermal oxide method thus fabricating the structure shown in FIG. 3A. The second insulation film 12 is a gate oxide film.

Figure 3B:
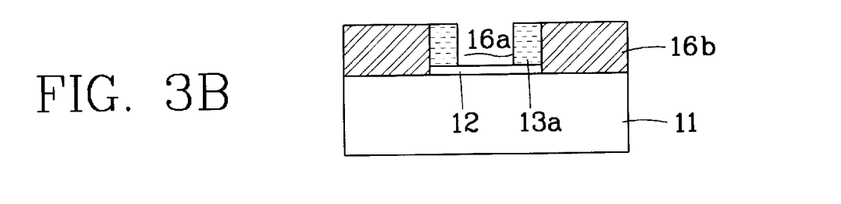

Thereafter, the first conductive film is formed at a thickness of 500~1500Å over the resultant structure shown in FIG. 3A before being etched back to achieve the pattern shown in FIG. 3B, the first conductive film being a doped polysilicon layer. A first conductive film sidewall spacer 13a, namely, a first conductive film pattern, is formed on both lateral walls of the opening 16a. The doped polysilicon layer may be formed by an in-situ process or may be formed by depositing a non-doped polysilicon layer and then doping a impurity into the polysilicon layer.

Figure 3C:
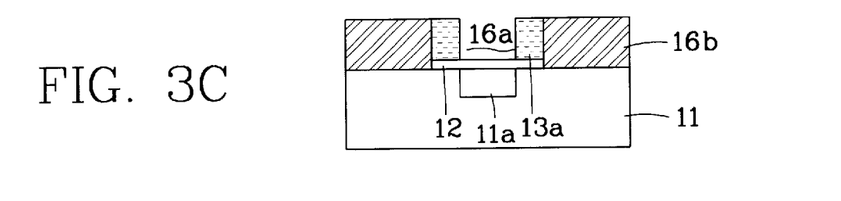

Next, in the structure of FIG. 3B, a p-type impurity is implanted into the portion of the surface of the semiconductor substrate 11 positioned below the second insulation film 12 and between the two portions of the first conductive pattern 13a, thereby forming a p-type doping layer 11a as shown in FIG. 3C. If the p-type doping layer 11a is not required due to the characteristic of the desired semiconductor device, the above process can be omitted. Since the p-type doping layer 11a is formed to control the threshold voltage Vth of the semiconductor device, if it is possible to obtain a desired threshold voltage by using the p-type impurity density of the semiconductor substrate 11 itself, the step of forming the p-type impurity layer 11a also can be omitted.

The second conductive film is subsequently deposited on the entire resultant structure shown in FIG. 3C and then is etched back. The second conductive film pattern 13b is filled into the inner side of the first conductive film pattern 13a formed in an inner wall of the opening 16a by chemical mechanical polishing (CMP), thereby fabricating the structure shown in FIG. 3D. Here, it is noted that the second conductive film is a metallic film, particularly, formed of W or TiN at a thickness of 2000~4000 Å.

Figure 3D:
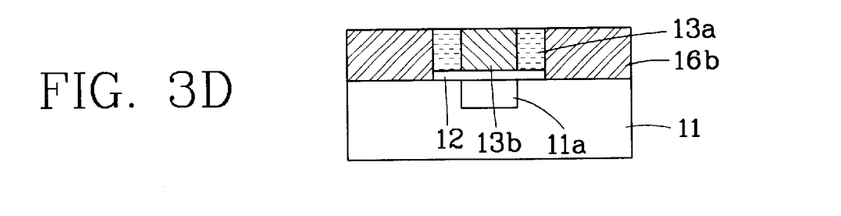
Figure 3E:
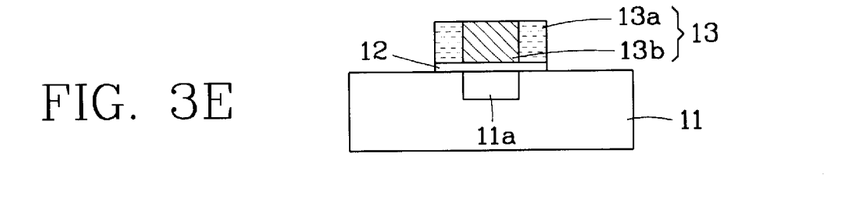
Figure 3F:
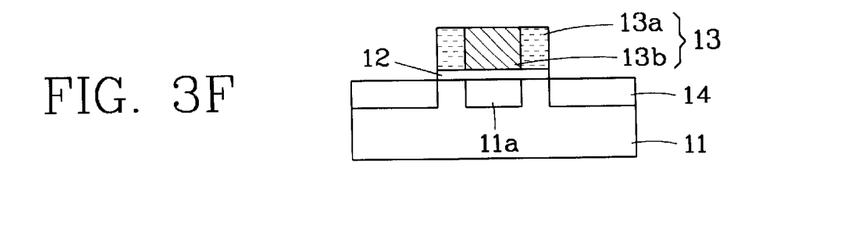

As shown in FIG. 3E, a wiring for a semiconductor device is formed, including the second conductive film pattern 13b formed in the center portion thereof by selectively etching the first insulation film pattern 16b and first conductive film patterns 13a formed at both sides of the second conductive film pattern 13b. The portions of the surface of the semiconductor substrate 11 at both sides of the wiring 13 are doped by the n-type impurity to form the n-type doping layer also known as the source/drain 14, so that the fabrication of the semiconductor device shown in FIG. 3F is completed.

As shown in FIG. 2B, the wiring for a semiconductor device according to another example of the first embodiment of the present invention is implemented by sequentially performing the steps of FIGS. 3A and 3B. Then, the barrier film formed of TiN or WNx is formed on the entire resultant structure shown in FIG. 3B. Thereafter, the barrier film is etched back to form the barrier film 13c at the lateral wall of the first conductive film pattern 13a, and then the steps of FIGS. 3C through 3E are sequentially performed to fabricate the wiring for the semiconductor device.

The structure of a semiconductor device and a wiring of FIG. 2A according to the first embodiment of the present invention can also be preferably fabricated as described hereinafter with respect to FIGS. 4A through 4F.

First, a first insulation film is deposited and patterned on the semiconductor substrate 11, thereby forming an opening 16a and a first insulation film pattern 16b. Here, the upper surface of the semiconductor substrate 11 is exposed through the opening 16a. A second insulation film 12 is formed on the upper surface of the exposed semiconductor substrate 11 by the thermal oxide method. Next, a third insulation film is formed on portions of the upper surface of the first insulation film pattern 16b and the second insulation film 12 and then etched back, and a third insulation film pattern 17a (a side wall spacer) is formed at both lateral walls of the opening 16a. The third insulation film is formed of a material, such as PSG, having a high etching selectivity to the first and second insulation film. The above-described steps are sequentially performed to fabricate a semiconductor substrate having a cross section as in FIG. 4A.

Figure 4A:
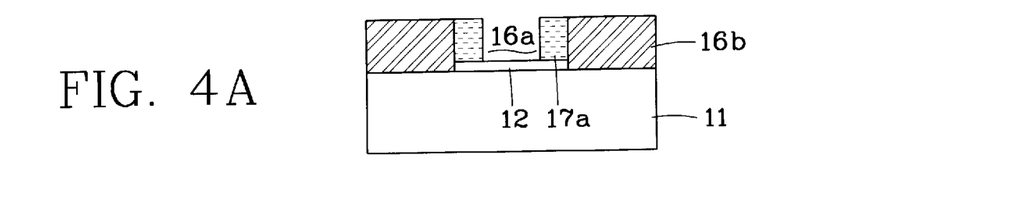
FIGS. 4A through 4E are cross-sectional views illustrating a wiring and a fabrication method of a semiconductor device of FIG. 2A according to another example of the first embodiment of the present invention.

During the etching-back process, when the third insulation film is removed, the portion of the second insulation film 12 positioned below the third insulation film pattern 17a may be removed for thereby exposing a predetermined portion of the semiconductor substrate 11, as shown in FIG. 4A'. In addition, as shown in FIG. 4A", there can be further provided a step in which a fourth insulation film 12' is selectively formed on the exposed portion of the upper surface of the semiconductor substrate 11, between the sidewall spacers 17a and the second insulation film 12 thereunder. Here, the fourth insulation film 12' is formed by the thermal oxide method or by depositing an oxide film or a nitride film. The fourth insulation film 12' may be formed of a material such as the second insulation film 12 or other different material. Further, the fourth insulation film 12' is formed in accordance with characteristics of the device irrespective of the thickness of the second insulation film 12. For example, the thickness of the insulation films 12 and 12' may be adjusted such that the portion of the insulation film 12 positioned below the first conductive film pattern 17a is different from the thickness of the portion of the insulation film 12' positioned below the second conductive film pattern 13b.

Figure 4B:
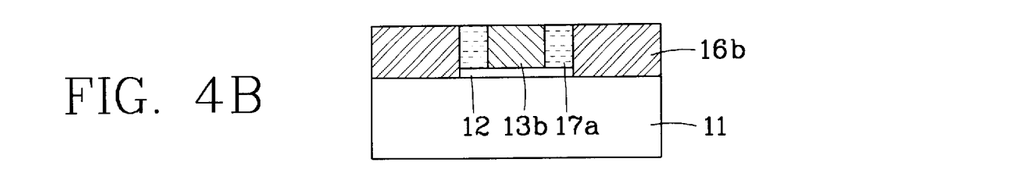

Next, regardless of whether the process of FIGS. 4A' through 4A" are performed to form fourth insulation film 12', a second conductive film pattern 13b is filled into the opening 16a inside the third insulation film patterns 17a, as shown in FIG. 4B, the second conductive film pattern 13b being formed of a metallic film such as a metal layer or a metal silicide layer. The second conductive film pattern 13b is formed by depositing the second conductive film over the entire resultant structure of FIG. 4A or FIG. 4A" and then performing the etch-back process thereto or CMP, or some conventional process.

Figure 4C:
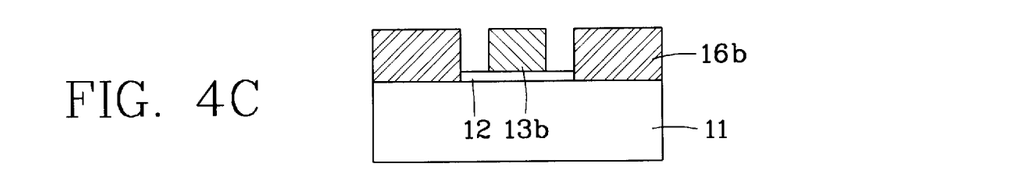

As shown in FIG. 4C, the third insulation film pattern 17a is selectively removed. If the third insulation film pattern 17a is formed of PSG, the third insulation film pattern can be removed by an HF vapor process.

Figure 4D:
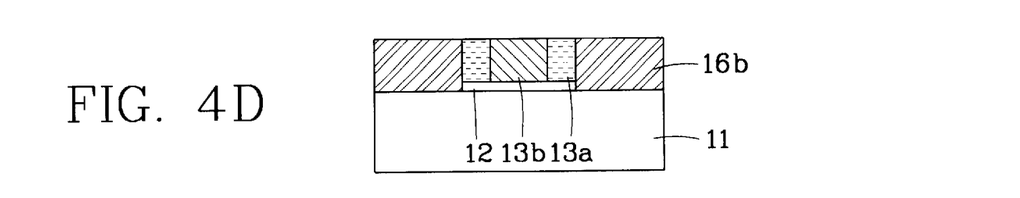

The first conductive film pattern 13a is formed on the portion in which the third insulation film pattern 17a is removed. The first conductive film pattern 13a is formed of a doped polysilicon layer. The first conductive film pattern 13a is formed in such manner that the first conductive film, namely, the doped polysilicon layer, is formed on the entire resultant structure of FIG. 4D, and the etch-back process or CMP is applied thereto. Next, the wiring step for a semiconductor device is completed by removing the first insulation film pattern 16b.

Figure 4E:
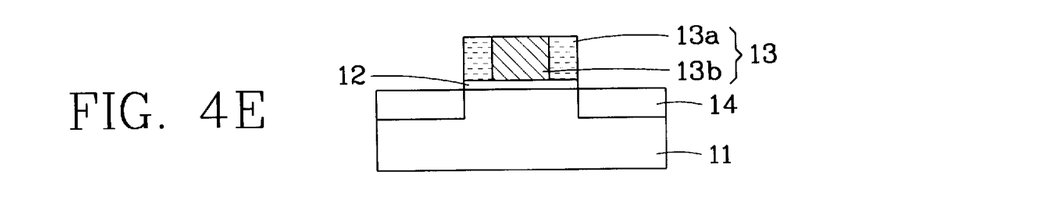

The n-type doping layer, the source/drain 14, is formed, as shown in FIG. 4E, by implanting an n-type impurity into the surface of the semiconductor substrate and at both sides of the wiring 13 of the semiconductor device in which the first conductive film patterns 13a are arranged at both sides of the second conductive film pattern 13a.

Figure 5A:
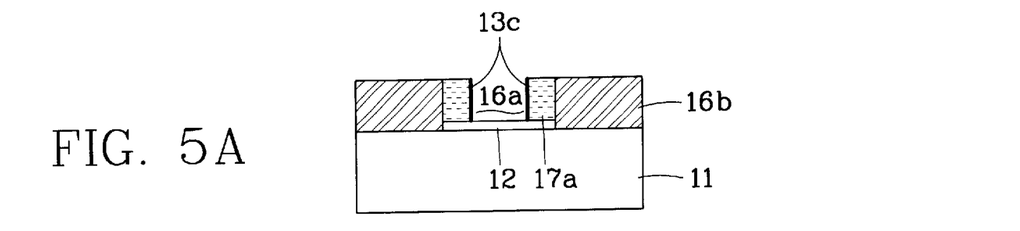
FIGS. 5A through 5E are cross-sectional views illustrating a wiring and fabrication method of the semiconductor device of FIG. 2B according to yet another example of the first embodiment.
Figure 5B:
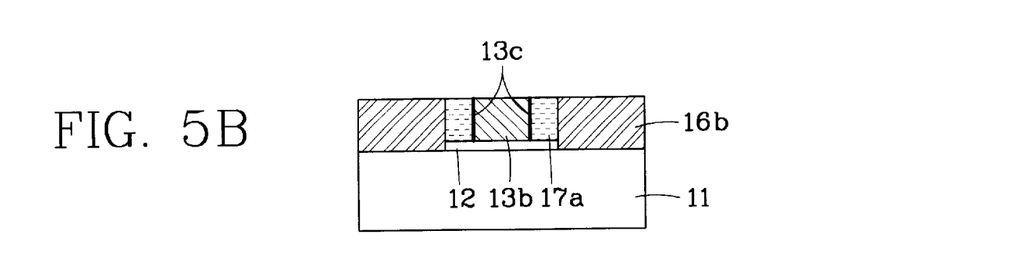
Figure 5C:
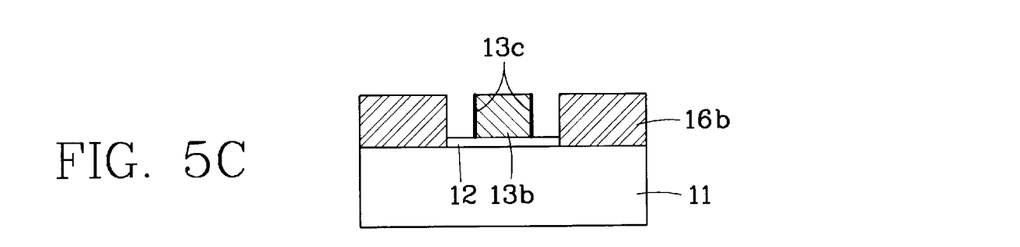
Figure 5D:
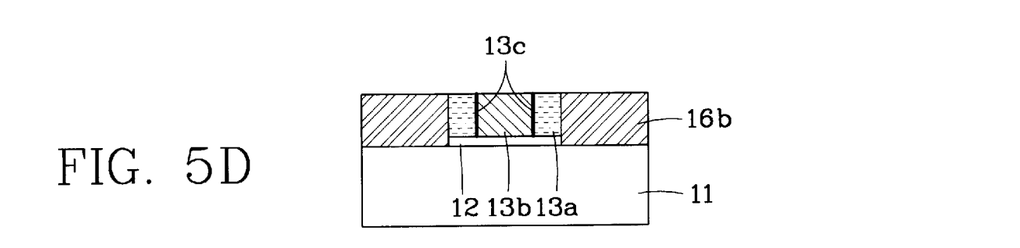
Figure 5E:
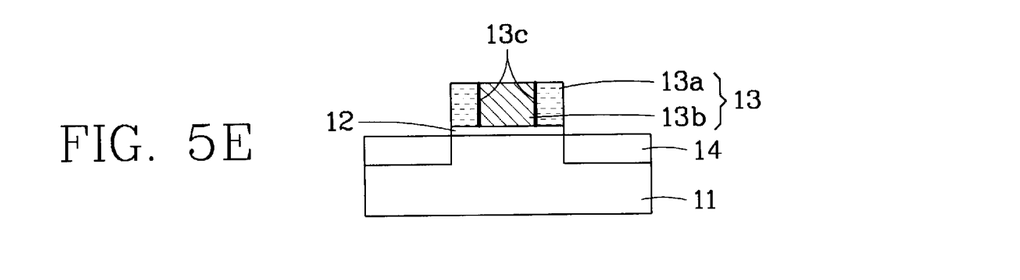

As shown in FIG. 5A–5E, after the steps shown in FIGS. 4A or 4A", there may be further provided steps to achieve the structure shown in FIG. 2B, where a barrier film is interposed between the first and second conductive film patterns. In FIG. 5A, a TiN or WNx layer is formed on the entire resultant structure shown in FIGS. 4A (or FIG. 4A") which is etched back before a barrier film 13A is formed on the exposed lateral surfaces of the third insulation film pattern 17a. The steps of FIGS. 5B through 5E are then sequentially performed similar to the steps of FIGS. 4B through 4E, so that the wiring for a semiconductor device according to another example of the first embodiment of the present invention is fabricated, which is similar to the embodiment of FIG. 2B.

The wiring for a semiconductor device and a semiconductor device adapting the same according to the second embodiment of the present invention may be fabricated by sequentially performing the steps of FIGS. 6A through 6F.

Figure 6A:
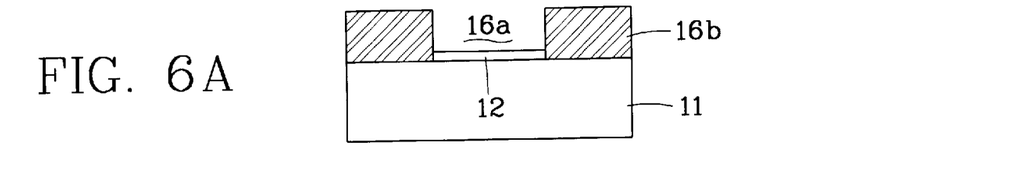
FIGS. 6A through 6F are cross-sectional views illustrating a wiring and a fabrication method of a semiconductor device of FIG. 2C which shows a second embodiment of the present invention.
Figure 6B:
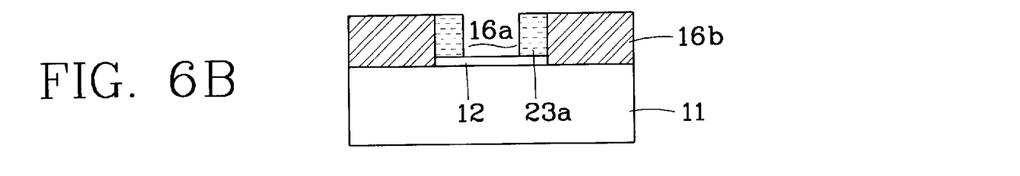
Figure 6C:
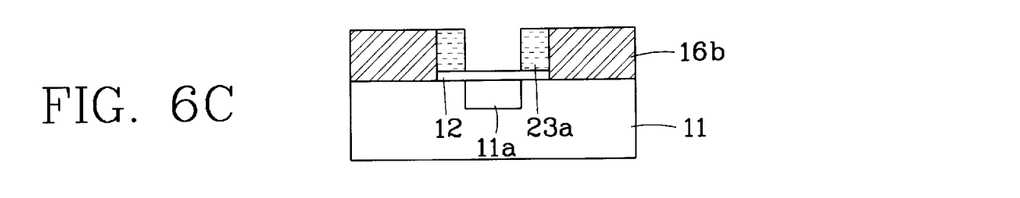

The steps of FIGS. 6A through 6C are sequentially performed in a manner similar to the steps of FIGS. 3A through 3C.

Figure 6D:
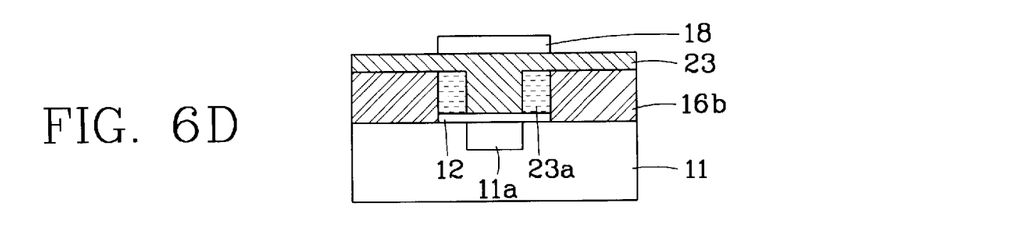

Next, as shown in FIG. 6D, the second conductive film 23 is formed on the entire resultant structure of FIG. 6C. Here, the second conductive film 23 is formed of one selected from the group comprising W or TiN and has a thickness of 2000~4000 Å.

Before the formation of the second conductive film 23, there can be further provided a step in which a TiN layer or a WNx layer is formed on the entire resultant structure of FIG. 6C and then is etched back, and a barrier layer 13c (shown in FIG. 2D) is formed on both lateral walls of the first conductive film pattern 13a.

After the formation of the second conductive film 23, as shown in FIG. 6D, a mask pattern 18 having the same size as the opening 16a is formed on the upper surface of the second conductive film 23 and in the portion of the opening 16a shown in FIG. 6A. Thereafter, the second conductive film 23 is etched using the mask pattern 18, and then the second conductive pattern 23b shown in FIG. 6E is formed.

Figure 6E:
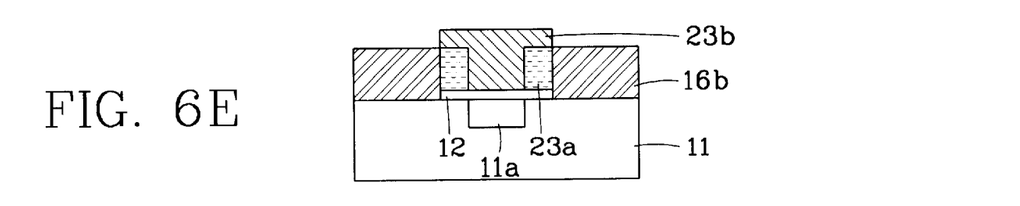
Figure 6F:
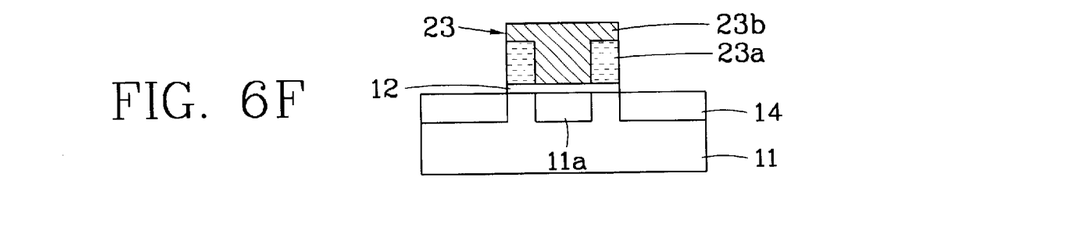

As shown in FIGS. 6E through 6F, the second insulation film pattern 16b is selectively etched.

An n-type impurity is doped on the surface of the semiconductor substrate 11 and at both sides of the wiring 23 to form source/drain regions 14, and then the fabrication of the semiconductor device is finished.

Figure 7A:
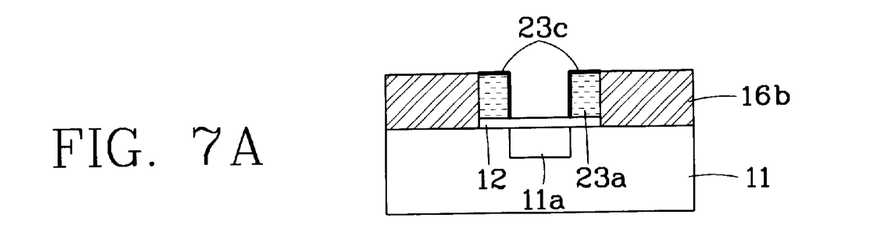
FIGS. 7A through 7D are cross-sectional views illustrating a wiring and fabrication method of the semiconductor device of FIG. 2D according to another example of the second embodiment.
Figure 7B:
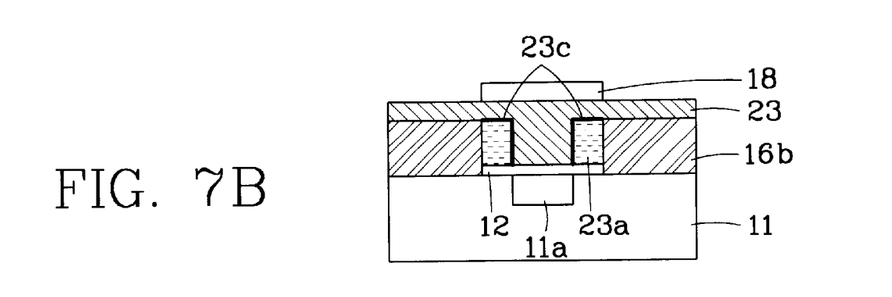
Figure 7C:
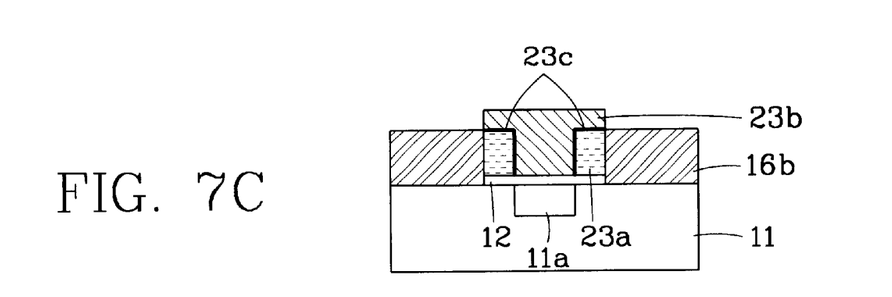
Figure 7D:
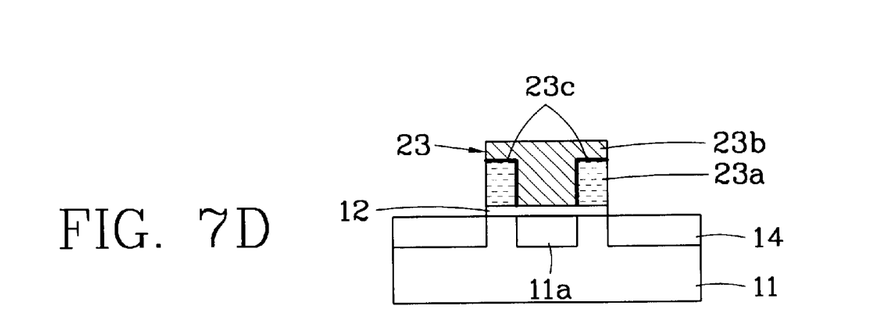

As shown in FIGS. 7A through 7D, after the step shown in FIG. 6B, there may be further provided steps to achieve the structure shown in FIG. 2D, in which a barrier film is interposed between the first and second conductive film patterns 23a, 23b. In FIG. 7A, a TiN or WNx layer is formed on the entire resultant structure shown in FIG. 6A which is etched back before barrier layer 23c is formed on the exposed surfaces of the first conductive film pattern 23a. Thereafter, in the step shown in FIG. 7B, second conductive film 23b is formed on barrier layer 23c and first insulation film pattern 16b, and the subsequent steps of FIGS. 7B through 7D are performed like those of FIGS. 6D through 6F, respectively.

As described above, in the present invention, it is possible to decrease the wiring resistance by arranging the metallic film on the center portion of the wiring and the characteristic of the device such as a current driving capability of the semiconductor device is enhanced by preventing the gate depletion phenomenon. In addition, a buried channel phenomenon is prevented by arranging the polysilicon layer pattern at both edge portions of the metallic film for thereby enhancing the characteristic of the semiconductor device.

In addition, in the present invention, the metallic film is used as a part of the gate electrode. When fabricating the CMOS transistor, the NMOS transistor gate electrode and the PMOS transistor gate electrode may be simultaneously fabricated using the above described processes; they need not be individually fabricated. Therefore, the fabrication process of the semiconductor device is simplified, so that the productivity of the semiconductor device is increased. While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regards as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A wiring method for a semiconductor device, comprising:

forming a first insulation film on a surface of a semiconductor substrate having a first conductive type;

patterning the first insulation film to form a first insulation film pattern having an opening that exposes a portion of the surface of the semiconductor substrate;

forming a second insulation film on the portion of the surface of the semiconductor substrate that is exposed through the opening;

forming a first conductive layer pattern above the second insulation film and at both lateral walls of the first insulation film defined by the opening;

forming a barrier film on a surface of said first conductive layer pattern; and forming a second conductive layer pattern in an opening defined by walls of opposing portions of the first conductive layer pattern that are separated, wherein the first conductive layer pattern and the second conductive layer pattern are formed of different materials.

2. The method of claim 1, further comprising:

removing the first insulation film pattern, and forming a doping layer of a second conductive type on the semiconductor substrate and at both sides of the wiring of the semiconductor device.

3. The method of claim 2, further comprising:

implanting an impurity into the surface of the semiconductor substrate through the opening and forming a doping layer of a first conductive type after forming the first conductive layer pattern.

4. The method of claim 2, wherein said barrier film is a TiN film or a WNX film said film being formed on an internal wall of the first conductive layer pattern after forming the first conductive layer pattern.

5. The method of claim 2, wherein said first conductive layer pattern is a doped polysilicon layer.

6. The method of claim 2, wherein said second conductive layer pattern is a metallic film.

7. The method of claim 2, wherein said second insulation film is one selected from the group comprising a silicon oxide film and a nitride film.

8. The method of claim 2, wherein forming the second conductive layer pattern into the opening defined by the walls of opposing portions of the first conductive layer pattern that are separated includes:

forming a second conductive layer on the entire resultant structure of the semiconductor substrate after the first conductive layer pattern is formed; and etching-back the second conductive layer.

9. The method of claim 2, wherein forming the second conductive layer pattern into the opening defined by the walls of opposing portions of the first conductive layer pattern that are separated includes:

forming a second conductive layer on the entire resultant structure of the semiconductor substrate after the first conductive layer pattern is formed; and performing a chemical mechanical polishing process with respect to the second conductive layer and planarizing the resultant structure until the first insulation film pattern is exposed.

10. A wiring formation method for a semiconductor device, comprising:

forming a first insulation film on a surface of a semiconductor substrate having a first conductivity type;

patterning the first insulation film to form a first insulation film pattern having an opening that exposes a portion of the surface of the semiconductor substrate;

forming a second insulation film on the portion of the surface of the semiconductor substrate exposed through the opening;

forming a first conductive layer pattern above the second insulation film and at both lateral walls of the first insulation film defined by the opening;

forming a barrier film on a surface of said first conductive layer pattern; and forming a second conductive layer pattern on upper surfaces of the first conductive layer pattern and in an opening defined by walls of opposing portions of the first conductive layer pattern that are separated, wherein the first conductive layer pattern and the second conductive layer pattern are formed of different materials.

11. The method of claim 10, wherein forming the second pattern on the upper surface of the first conductive layer pattern and in the opening defined by walls of opposing portions of the first conductive layer patterns includes:

forming a second conductive layer on the entire resultant structure of the semiconductor substrate after the first conductive layer pattern is formed;

forming a mask pattern on the opening defined by walls of opposing portions of the second conductive layer for covering the opening defined by walls of opposing portions of the first insulation film pattern; and etching the second conductive layer using the mask pattern as a mask.

12. A wiring method for a semiconductor device, comprising:

forming a first insulation film on a surface of a semiconductor substrate having a first conductive type;

patterning the first insulation film to form a first insulation film pattern and an opening that exposes a portion of the surface of the semiconductor substrate;

forming a second insulation film on the portion of the surface of the semiconductor substrate that is exposed through the opening;

forming a third insulation layer pattern on both lateral walls of the opening;

forming a second conductive layer pattern in the opening and inside the third insulation layer pattern;

removing the third insulation layer pattern; and forming a first conductive layer pattern in an opening that is defined between the first insulation film and the second conductive layer pattern and that is created by the removal of the third insulation layer pattern.

13. The method of claim 12, further comprising:

removing the first insulation film pattern, and forming a doping layer of a second conductive type on the semiconductor substrate and at both sides of the wiring.

14. The method of claim 12, wherein said third insulation film pattern is formed of PSG.

15. The method of claim 12, wherein after said third insulation layer pattern is formed, the method further comprises:

removing a predetermined portion of the second insulation film which is not covered by the third insulation layer; and forming a fourth insulation film on the portion in which the second insulation film is removed.

* * * * *